United States Patent [19]

Yagi

[11] Patent Number: 4,541,014

[45] Date of Patent: Sep. 10, 1985

[54] CONTOUR CORRECTING CIRCUIT

[75] Inventor: Yasuo Yagi, Tokyo, Japan

[73] Assignee: Pioneer Electronic Corporation, Tokyo, Japan

[21] Appl. No.: 504,660

[22] Filed: Jun. 15, 1983

[30] Foreign Application Priority Data

Jun. 15, 1982 [JP] Japan ................................ 57-101336

[51] Int. Cl.³ ............................................. H04N 5/16
[52] U.S. Cl. ..................................... 358/166; 358/37; 358/162
[58] Field of Search .................. 358/166, 162, 37, 167

[56] References Cited

U.S. PATENT DOCUMENTS 3,715,473 2/1973 Tan ........................................ 358/37
3,732,360 5/1973 Breimer ................................ 358/37
3,995,108 11/1976 Morrison ............................. 358/162
4,360,830 11/1982 Poetsch ............................... 358/166

Primary Examiner—Tommy P. Chin
Attorney, Agent, or Firm—Sughrue, Mion, Zinn, Macpeak & Seas

[57] ABSTRACT

A contour correcting circuit emphasizes the contour of a video signal by increasing the rise and fall characteristics of the signal by using a high frequency extraction circuit in combination with a delay circuit and an adder adding in the delay output to the extracted signal. An amplitude limiter limits the adder output to between upper and lower limits of the input video signal and a second delayed signal.

2 Claims, 11 Drawing Figures

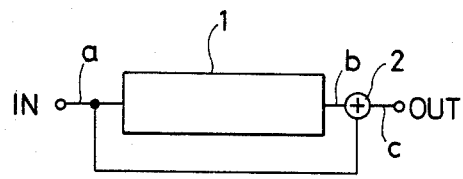
FIG. 1 PRIOR ART
FIG. 2a PRIOR ART
FIG. 2b PRIOR ART
FIG. 2c PRIOR ART
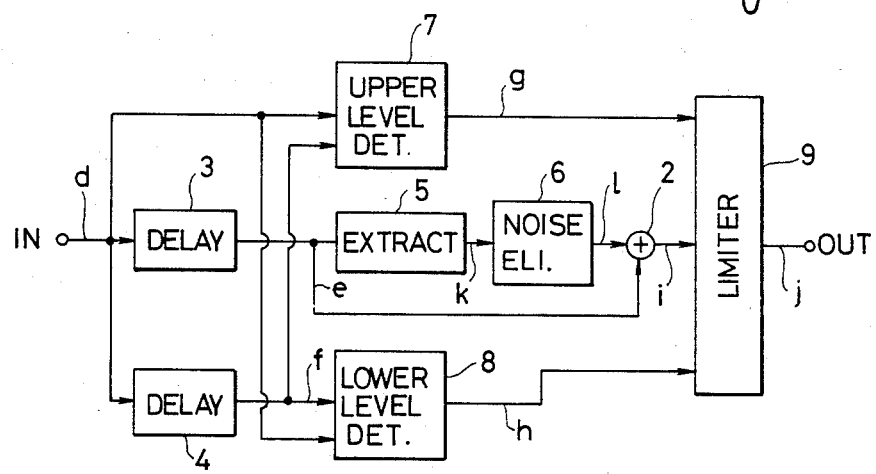
FIG. 3

CONTOUR CORRECTING CIRCUIT

BACKGROUND OF THE INVENTION

This invention relates to a contour correcting circuit for emphasizing the contour of a video signal.

A conventional contour correcting circuit is shown in FIG. 1. In FIG. 1, reference numeral 1 designates a high frequency extraction circuit for extracting a high frequency component from an input video signal; and 2, an addition circuit for adding the output of the high frequency extraction circuit 1 to the input video signal. The high frequency extraction circuit is, in general, a secondary high-pass filter, or a secondary differentiation circuit using a delay line.

In the case where the secondary differentiation circuit is employed as the high frequency extraction circuit 1, a high frequency component is extracted from the video signal (shown in part (a) of FIG. 2) by the high frequency extracting circuit 1 as shown in part (b) of FIG. 2, and is then added to the input video signal by the addition circuit 2, as a result of which an output as shown in part (c) of FIG. 2 is provided at the output terminal.

However, the conventional contour correcting circuit is disadvantageous in that, since the high frequency component extracted from the input video signal is added to the input video signal, the noise is increased and accordingly the S/N ratio is lowered. Furthermore, the contour correcting circuit suffers from a difficulty in that preshooting or overshooting increases the contrast ratio of the contour, thus lowering the picture quality.

In addition, the contour correcting circuit involves a problem in that, if the overshoot is decreased to a level small, it becomes impossible to make the signal's rise and fall characteristics steep.

SUMMARY OF THE INVENTION

In view of the foregoing, an object of this invention is to provide a contour correcting circuit in which the above-described difficulties accompanying the conventional contour correcting circuit have been eliminated, so that the rise and fall characteristics of an input signal are made steep with preshoot and overshoot being eliminated, and with the S/N ratio maintained at a high level.

BRIEF DESCRIPTION OF THE DRAWINGS

FIG. 1 is a block diagram of a conventional contour correcting circuit;

FIGS. 2a, 2b and 2c are waveform diagrams for describing the operation of the contour correcting circuit of FIG. 1;

FIG. 3 is a block diagram showing an embodiment of this invention; and

DETAILED DESCRIPTION OF THE PREFERRED EMBODIMENTS

Figure 4A:
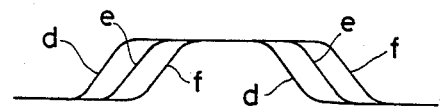
FIGS. 4(A) to 4(F) are waveform diagrams for describing the operation of the embodiment of the invention.

FIG. 3 is a block diagram showing one embodiment according to the invention. In FIG. 3, reference numeral 3 designates a delay circuit having a delay time $t_1$; 4, a delay circuit having a delay time $t_2$ ($t_1 < t_2$); and 5, a high frequency extraction circuit such as a quadratic differentiation circuit. The output of the delay circuit 3 is applied to the quadratic differentiation circuit 5.

Further in FIG. 3, reference numeral 6 designates a noise eliminating circuit; 7, an upper level detecting circuit; 8, a lower level detecting circuit; and 9, a limiter. The output of the quadratic differentiation circuit 5 is supplied to the noise eliminating circuit 6, and the output of the latter is added to the output of the delay circuit 3. On the other hand, the input video signal and the output of the delay circuit 4 are applied to the upper level detecting circuit 7 and the lower level detecting circuit 8, so that a high level signal may be detected by the upper level detecting circuit 7 while a low level signal is detected by the lower level detecting circuit 8. The output of the addition circuit 2 and the outputs of the detecting circuit 7 and 8 are applied to the limiter 9. The limiter delivers the output of the addition circuit 2 with the upper amplitude being controlled by the upper level detecting circuit 7 and with the lower amplitude being controlled by the lower level detecting circuit 8.

Figure 4B:
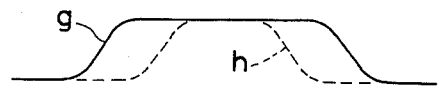
Figure 4C:
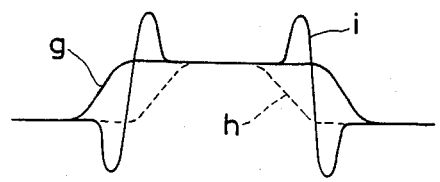
Figure 4D:
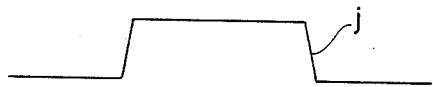
Figure 4E:
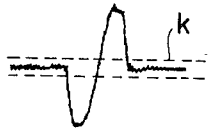
Figure 4F:
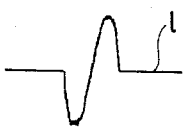

It is assumed that, in the embodiment thus organized, a video signal d whose waveform is as indicated by the curve d in part (A) of FIG. 4 is supplied to the input terminal IN.

As the video signal d is delayed by the delay circuits 3 and 4, the waveform of the output signal e of the delay circuit 3 is as indicated by the curve e in part (A) of FIG. 4 while the waveform of the output signal f of the delay circuit 4 is as indicated by the curve f in part (A) of FIG. 4.

The video signal which has been delayed by the time $t_1$ by the delay circuit 3, i.e., the output signal e of the delay circuit 3, is applied to the quadratic differentiation circuit 5, where its high fequency component is extracted. That is, the output signal k of the secondary differentiation circuit 5 is as indicated by the curve k in part (E) of FIG. 4.

The output signal k of the quadratic differentiation circuit contains a noise component. It can be considered that there is a sufficient level difference between the noise component and the contour component. Accordingly, the noise component can be eliminated by cutting out the small level components in the output signal k of the quadratic differentiation circuit 5 using the noise eliminating circuit 6. The waveform of the output signal l of the noise eliminating circuit 6 is as indicated by the curve l in part (F) of FIG. 4.

The output signal l of the noise eliminating circuit 6 is added to the video signal e (in part (A) of FIG. 4) by the addition circuit 2, so that the latter outputs a signal as indicated by the curve i in part (C) of FIG. 4. That is, the output signal i increases the rise and fall characteristics of the video signal d but includes preshoot and overshoot.

On the other hand, the upper level detecting circuit 7 operates to output the larger in level of the curves d and f of part (A) of FIG. 4. Therefore, the output signal g of the upper level detecting circuit 7 is as indicated by the curve g in part (B) of FIG. 4. The lower level detecting circuit 8 operates to output the smaller in level of the curves d and f in part (A) of FIG. 4. Therefore, output signal h of the lower level detecting circuit 8 is as indicated by the curve h in part (B) of FIG. 4.

The upper part of the output signal i of the addition circuit 2 is limited by the output signal g of the upper level detecting circuit 7, while the lower part of the output signal i is limited by the output signal h of the lower level detecting circuit 8. As a result, the shaded parts of the signal are eliminated by the limiter 9; that is, the limiter 9 outputs a signal j as indicated in part (D) of FIG. 4.

As is apparent from the curve j in part (D) of FIG. 4, the rise and fall characteristics of the output signal j of the limiter 9 are steep, the signal j includes no overshoot or preshoot, and the S/N ratio is improved.

The delay circuits 3 and 4 may use delay lines having delay times $t_1$ and $t_2$, respectively. Furthermore, delay lines having delay times $t_1$ and $t_3$ ($t_3 = t_2 - t_1$) may be connected in series to the delay circuit 4. In addition, an intermediate tap may be provided on the delay line having the delay time $t_2$, to obtain the delay time $t_1$.

The quadratic differentiation circuit 5 may be one having a coil L and a capacitor C, an active filter, or a delay line. That is, it may be replaced by any circuit which can extract only the contour component.

As is apparent from the above description, the contour correcting circuit according to the invention can provide a contour-corrected video signal which has no overshoot or preshoot, without lowering the S/N ratio.

What is claimed is:

1. A contour correcting circuit, comprising;
    first delay means for delaying an input video signal by a first period of time ($t_1$);
    second delay means for delaying said input video signal by a second period of time ($t_2$), the second period of time being longer than the first period of time ($t_1 < t_2$);
    a high frequency extraction circuit for extracting a high frequency component from an output signal of said first delay means;
    an addition circuit for subjecting to addition an output signal of said high frequency extracting circuit and an output signal of said first delay means;
    an upper level detecting circuit for selecting the larger in level of said input video signal and an output signal of said second delay means;
    a lower level detecting circuit for selecting the smaller in level of said input video signal and an output signal of said second delay means; and
    amplitude limiting means for eliminating an addition circuit output signal which is larger than the level of an output signal of said upper level detecting circuit and an addition circuit output signal which is smaller than the level of an output signal of said lower level detecting circuit.

2. A circuit as claimed in claim 1, further including noise elimination circuit means coupled between said high frequency extraction circuit and said addition circuit.

* * * * *